United States Patent
Wang et al.

(10) Patent No.: US 6,825,567 B1
(45) Date of Patent: Nov. 30, 2004

(54) FACE-TO-FACE MULTI-CHIP FLIP-CHIP PACKAGE

(75) Inventors: Meng-Jen Wang, Pingtung (TW); Yu-Wen Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/642,823

(22) Filed: Aug. 19, 2003

(51) Int. Cl.[7] .......................... H01L 23/28; H01L 23/48
(52) U.S. Cl. ..................... 257/777; 257/787; 257/778
(58) Field of Search ............................... 257/777, 778, 257/787, 723

(56) References Cited

U.S. PATENT DOCUMENTS

| | | | | |
|---|---|---|---|---|
| 5,760,478 A | * | 6/1998 | Bozso et al. | 257/777 |
| 5,790,384 A | * | 8/1998 | Ahmad et al. | 361/760 |
| 5,804,882 A | * | 9/1998 | Tsukagoshi et al. | 257/783 |
| 5,869,894 A | * | 2/1999 | Degani et al. | 257/723 |
| 6,084,308 A | * | 7/2000 | Kelkar et al. | 257/777 |
| 6,100,593 A | * | 8/2000 | Yu et al. | 257/777 |
| 6,150,724 A | * | 11/2000 | Wenzel et al. | 257/777 |
| 6,239,484 B1 | * | 5/2001 | Dore et al. | 257/687 |
| 2003/0209808 A1 | * | 11/2003 | Baba | 257/777 |

* cited by examiner

*Primary Examiner*—Jasmine Clark
(74) *Attorney, Agent, or Firm*—Troxell Law Office PLLC

(57) ABSTRACT

A face-to-face multi-chip flip-chip package includes a first chip, at least a second chip and a package substrate. The package substrate has a top surface, a bottom surface and a concave wall between the top surface and the bottom surface. The second chip is flip-chip mounted on active surface of the first chip. The first chip is mounted on the package substrate so that the second chip is placed inside a chip accommodation space of the package substrate which is defined by the concave wall. A side surface of the second chip is a progressive distance from the chip accommodation space for lessening capillary flow of underfilling material between the concave wall of the package substrate and the side surface of the second chip during dispensing the underfilling material.

18 Claims, 2 Drawing Sheets

FACE-TO-FACE MULTI-CHIP FLIP-CHIP PACKAGE

FIELD OF THE INVENTION

The present invention is relating to a multi-chip flip-chip package, particularly to a face-to-face multi-chip flip-chip package.

BACKGROUND OF THE INVENTION

An improved multi-chip flip-chip package had been disclosed in U.S. Pat. No. 6,084,308 entitled "chip-on-chip integrated circuit package and method for making the same". A face-to-face flip chip assembly comprises a first chip and a second chip, and mounted on a package substrate. The package substrate has a cavity so as to accommodate a second chip which is face-to-face flip-chip mounted on the first chip. Also an insulation body is formed between the first chip and the second chip by capillary filling method. But a problem is that air pocket happens easily in the insulation body due to different capillary flowing speed. Please referring to FIG. 1, a common face-to-face multi-chip flip-chip package is disclosed. A second chip 30 that is smaller than a first chip 20 in size is flip-chip mounted onto the first chip 20, and furthermore the second chip 30 is placed in the opening 11 of the package substrate 10. When an underfilling material 40 is dispensed, the flow speed of the underfilling material 40 between square lateral walls of the opening 11 and the second chip 30 is much faster than that under active surface of the second chip 30 with the bumps under capillary effect. When the underfilling material 40 had flowed fast between the opening 11 and the second chip 30 and closed up the perimeters of the second chip 30, the underfilling material 40 among the bumps under the second chip 30 stop capillary flow to cause air pocket between the second chip 30 and the first chip 20 resulting in serious dispensing failure. Normally, the opening 11 of the common substrate 10 is rectangle so that the stress would be concentrated at the corners of the opening 11 to decrease the reliability of the product.

SUMMARY

A primary object of the present invention is to provide a face-to-face multi-chip flip-chip package to solve the problem of harmful capillary flow of an underfilling material. The face-to-face multi-chip flip-chip package includes a package substrate having a concave wall to define a chip accommodation space. The concave wall is not parallel to an adjacent side surface of second chip inside the chip accommodation space. The concave wall is designed to reduce the capillary flow speed of underfilling material between the side surface of second chip and the chip accommodation space of the package substrate so as to avoid forming air pocket between second chip and first chip while dispensing underfilling material.

A secondary object of the present invention is to provide a face-to-face multi-chip flip-chip package. The face-to-face multi-chip flip-chip package includes a package substrate having a chip accommodation space defined by a concave wall for diminishing stress concentration of the package substrate.

According to the present invention, a face-to-face multi-chip flip-chip package comprises a package substrate having a top surface, a bottom surface and a concave wall between the top surface and the bottom surface. The concave wall defines a chip accommodation space, such as an opening or a cavity on the bottom surface. Preferably, the chip accommodation space is an opening in the shape of circular or elliptic shape to avoid the problem of stress concentration. A first chip, such as logic chip or other big size of chip, is mounted to the package substrate. The first chip has a first active surface with first bumps and a first back surface. The first chip is flip-chip mounted to the bottom surface of the package substrate. At least a second chip, such as a memory chip with a small size or other small size of chip, is flip-chip mounted to the first chip. The second chip has a second active surface, a second back surface and a plurality of side surfaces between the second active surface and the second back surface. Preferably, the second chip is disposed inside the chip accommodation space. By means of face-to-face flip-chip mounting technique, bumps are formed between the second active surface of the second chip and the first active surface of the first chip. An underfilling material is formed between the first chip and the second chip by dispensing method. The concave wall has a progressive distance (not parallel) from adjacent side surfaces of the second chip, that is the four corners of the second chip are closer to the concave wall to influence flow resistant of underfilling material, so that the capillary flow speed of the underfilling material between the side surfaces of the second chip and the concave wall will be reduced.

DETAILED DESCRIPTION OF THE PRESENT INVENTION

Figure 1:
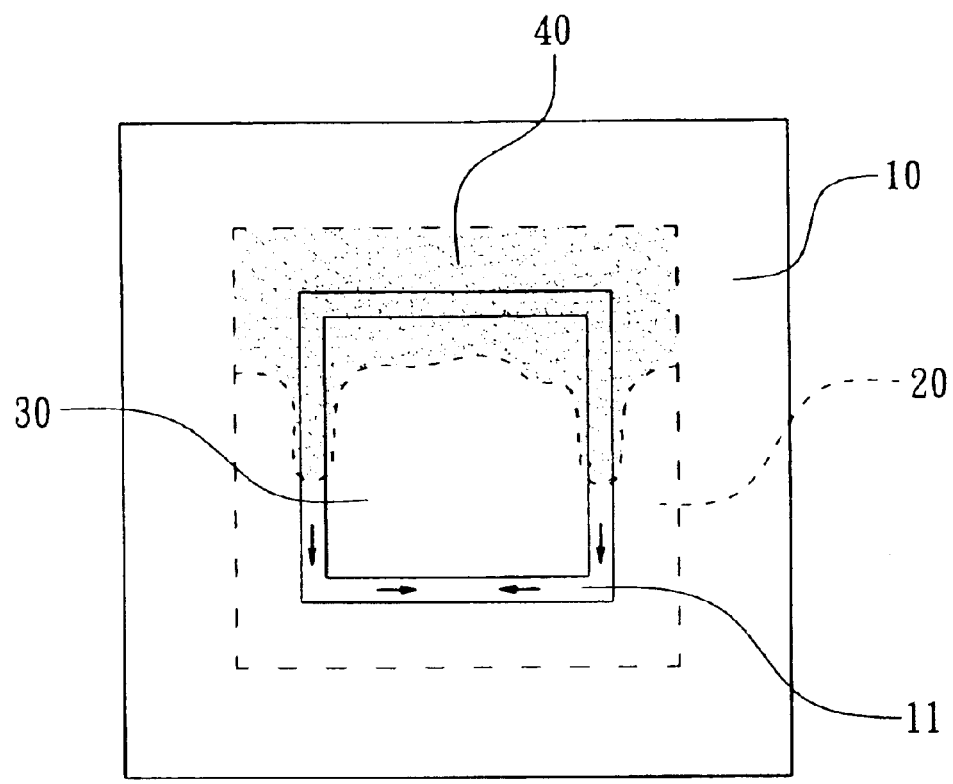
FIG. 1 is a top view of a conventional face-to-face multi-chip flip-chip package when dispensing an underfilling material.

Referring to the drawings attached, the present invention will be described by means of the embodiments below.

Figure 2:
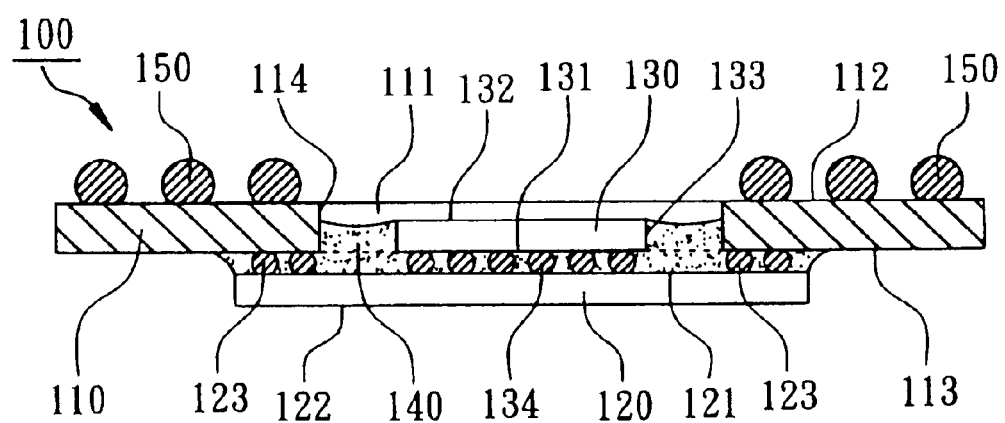
FIG. 2 is a cross-sectional view of a face-to-face multi-chip flip-chip package in accordance with the present invention.

According to an embodiment of the present invention, referring to FIG. 2, a face-to-face multi-chip flip-chip package 100 mainly comprises a package substrate 110, a first chip 120, at least a second chip 130 and an underfilling material 140.

The package substrate 110 is a circuit board of chip carrier, such as printed circuit board, ceramic circuit board or flexible circuit film. The package substrate 110 has a top surface 112, a bottom surface 113 and a concave wall 114 between the top surface 112 and the bottom surface 113. The concave wall 114 defines a chip accommodation space 111 which is a disc-like shape larger than the second chip 130 for containing the second chip 130. The chip accommodation space 111 may be an opening or a cavity on the bottom surface 113. In this embodiment, the chip accommodation space 111 is an opening passing through the top surface 112 and the bottom surface 113. It is preferable that the chip accommodation space 111 is an opening in shape of circular or elliptic shape. The chip accommodation space 111 is smaller than the first chip 120 and larger than the second chip 130.

The first chip 120 has a first active surface 121 and a first back surface 122 corresponding to the first active surface 121. The first chip 120 may be a logic chip, microcontroller or memory chip, which is larger than the second chip 130 in size. In this embodiment, the first chip 120 is larger than a chip accommodation space 111 of the package substrate 110. A plurality of first bumps 123 are formed on perimeters of the first active surface 121 of the first chip 120. The first active surface 121 of the first chip 120 faces toward the package substrate 110 and is flip-chip mounted to the bottom surface 113 of the package substrate 110.

The second chip 130 is flip-chip mounted to the first chip 120 and smaller than the first chip 120. Preferably, the second chip 130 is disposed inside the chip accommodation space 111. The second chip 130 may be a memory or a driver chip. The second chip 130 has a second active surface 131, a second back surface 132 corresponding to the second active surface 131 and a plurality of side surfaces 133 between the second active surface 131 and the second back surface 132. The second bumps 134 are formed on the second active surface 131 for outer electrical connection. Normally the side surfaces 133 of the second chip 130 are formed by dicing a wafer and are vertical to the second active surface 131 and the second back surface 132. The second active surface 131 of the second chip 130 faces to the first active surface 121 of the first chip 120 by flip-chip mounting the second chip 130 to the first active surface 121 of the first chip 120, and the second bumps 134 are bonded between the second chip 130 and the first chip 120 in array. The side surfaces 133 of the second chip 130 have a progressive distance from the concave wall 114 for influencing flow speed of the underfilling material 140 during dispensing.

The thermosetting underfilling material 140 sealing the bumps 123, 134 is formed between the first chip 120 and the second chip 130 by dispensing method. Furthermore, a plurality of solder balls 150 are formed on the top surface 112 or the bottom surface 113 of the package substrate 110 for surface mounting. In this embodiment, the solder balls 150 are formed on the top surface 112 of the package substrate 110.

Figure 3:
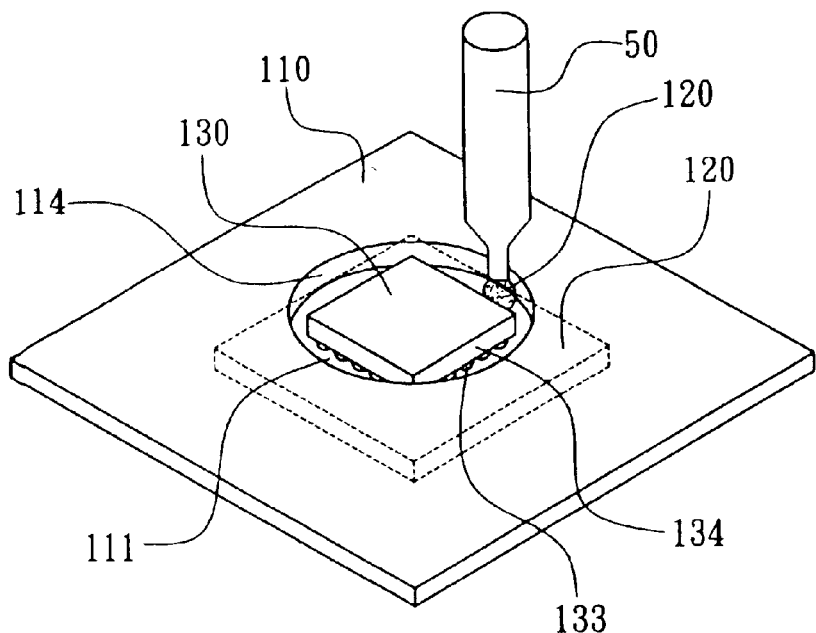
FIG. 3 is a three-dimension view of a face-to-face multi-chip-flip-chip package during dispensing an underfilling material in accordance with the present invention.
Figure 4:
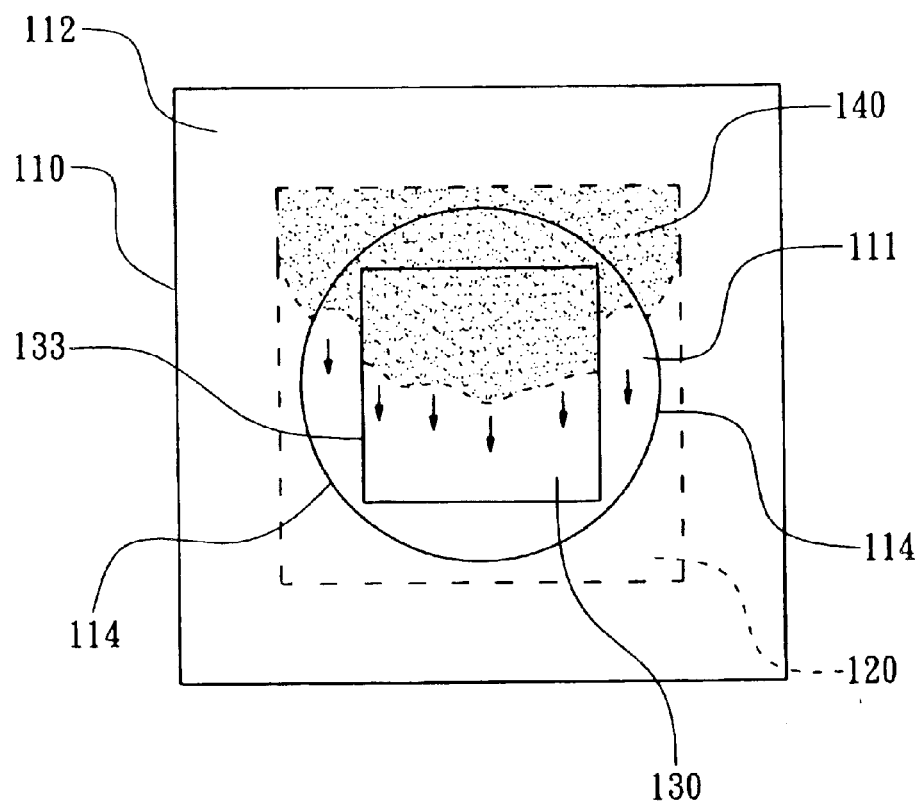
FIG. 4 is a top view of a face-to-face multi-chip flip-chip package in condition of flow of a dispensed underfilling material in accordance with the present invention.

Referring to FIG. 3 and 4, during a packaging process the un-solidified underfilling material 140 is dispensed into the interval between one of side surfaces 133 of the second chip 130 and the concave wall 114 by dispensing equipment 50. The underfilling material 140 flow outward due to capillary reaction. The concave wall 114 has a progressive distance from the side surface 133, that is to say, not parallel to the near side surface 133 of the second chip 130. The four corners of the second chip 130 are closer to the concave wall 114 of the package substrate 110 so that there is a larger flow resistance of the underfilling material 140 at the corners of the second chip 130 to enable to lessen the capillary flow of the underfilling material 140 between the concave wall 114 and the near side surface 133 thereof to be reduced effectively. The capillary flow speed of the underfilling material 140 between the concave wall 114 and the near side surface 133 of the second chip 130 is slower than that between the second chip 130 and the first chip 120 (as showed in FIG. 4). Therefore, the underfilling material 140 certainly is filled in the space between the second chip 130 and the first chip 120 in order to avoid forming air pocket between the second chip 130 and the first chip 120. Accordingly, the face-to-face multi-chip flip-chip package 100 effectively solves against air pocket formed by the underfilling material 140 in the face-to-face multi-chip flip-chip package, and releases stress concentration because the chip accommodation space 111 is an opening in shape of circular or elliptic shape.

The above description of embodiments of this invention is intended to be illustrated and not limiting. Other embodiments of this invention will be obvious to those skilled in the art in view of the above disclosure.

What is claimed is:

1. A face-to-face multi-chip flip-chip package comprising:
   a package substrate having a top surface, a bottom surface and a concave wall between the top surface and the bottom surface, wherein the concave wall defines a chip accommodation space;
   a first chip having a first active surface and a first back surface, wherein the first active surface of the first chip faces to the bottom surface of the package substrate;
   at least a second chip having a second active surface, a second back surface and a side surface between the second active surface and the second back surface of the second chip, wherein the second active surface of the second chip faces to the first active surface of the first chip, the concave wall is not parallel to the side surface of the second chip; and
   an underfilling material formed between the first chip and the second chip.

2. The face-to-face multi-chip flip-chip package of claim 1, wherein the chip accommodation space is an opening passing through the top surface and the bottom surface of the package substrate.

3. The face-to-face multi-chip flip-chip package of claim 2, wherein the opening is circular or elliptic shape.

4. The face-to-face multi-chip flip-chip package of claim 1, wherein a plurality of solder balls are formed on the package substrate.

5. The face-to-face multi-chip flip-chip package of claim 1, wherein the first chip is a logic chip.

6. The face-to-face multi-chip flip-chip package of claim 1, wherein the size of the first chip is larger than the size of the chip accommodation space.

7. The face-to-face multi-chip flip-chip package of claim 1, wherein the second chip is a memory chip.

8. The face-to-face multi-chip flip-chip package of claim 1, wherein the size of the second chip is smaller than the size of the first chip.

9. The face-to-face multi-chip flip-chip package of claim 1, wherein the size of the chip accommodation space is smaller than the size of the first chip and larger than the size of the second chip.

10. The face-to-face multi-chip flip-chip package of claim 1, wherein the second chip is disposed inside the chip accommodation space.

11. The face-to-face multi-chip flip-chip package of claim 1, wherein the underfilling material is filled in the chip accommodation space.

12. The face-to-face multi-chip flip-chip package of claim 1, further comprising a plurality of first bumps formed between the first chip and the package substrate.

13. The face-to-face multi-chip flip-chip package of claim 12, wherein the underfilling material encloses the first bumps.

14. The face-to-face multi-chip flip-chip package of claim 1, wherein the concave wall is located a progressive distance from the side surface of the second chip.

15. The face-to-face multi-chip flip-chip package of claim 1, wherein the underfilling material is disposed between the side surface of the second chip and the concave wall.

16. A face-to-face multi-chip flip-chip package comprising:
   a package substrate having a top surface, a bottom surface and a concave wall between the top surface and the bottom surface, wherein the concave wall defines a chip accommodation space, the concave wall is curvilinear;

a first chip having a first active surface and a first back surface, wherein the first active surface of the first chip faces to the bottom surface of the package substrate;

a plurality of first bumps formed between the first chip and the package substrate;

at least a second chip having a second active surface, a second back surface and a side surface between the second active surface and the second back surface of the second chip, wherein the second active surface of the second chip faces to the first active surface of the first chip; and an underfilling material formed between the first chip and the second chip.

17. The face-to-face multi-chip flip-chip package of claim 16, wherein the size of the chip accommodation space is smaller than the size of the first chip and larger than the size of the second chip.

18. The face-to-face multi-chip flip-chip package of claim 16, wherein the concave wall is located a progressive distance from the side surface of the second chip.

* * * * *